(12) United States Patent
Behrens et al.

(10) Patent No.: US 7,165,984 B1
(45) Date of Patent: Jan. 23, 2007

(54) OPERATING ELEMENT WITH ON AND/OR OFF LEVER PIECE FOR PRINTED CIRCUIT BOARDS

(75) Inventors: Ralf Behrens, Nürnberg (DE); Werner Körber, Betzenstein (DE); Siegfried Kurrer, Nürnberg (DE); Kurt-Michael Schaffer, Eckental (DE)

(73) Assignee: Rittal RES Electronic Systems GmbH & Co. KG, Eckental (DE)

( * ) Notice: Subject to any disclaimer, the term of this patent is extended or adjusted under 35 U.S.C. 154(b) by 300 days.

(21) Appl. No.: 10/149,570

(22) PCT Filed: Aug. 3, 2000

(86) PCT No.: PCT/DE00/02601

§ 371 (c)(1),
(2), (4) Date: Oct. 15, 2002

(87) PCT Pub. No.: WO01/47331

PCT Pub. Date: Jun. 28, 2001

(30) Foreign Application Priority Data

Dec. 22, 1999 (DE) ............................. 299 22 557 U

(51) Int. Cl.
*H01R 13/62* (2006.01)
(52) U.S. Cl. ..................................... 439/157
(58) Field of Classification Search ............... 439/157, 439/154, 372, 155, 152, 160, 159
See application file for complete search history.

(56) References Cited

U.S. PATENT DOCUMENTS

| 4,537,454 | A | * | 8/1985 | Douty et al. ................. 439/157 |
| 4,648,009 | A | * | 3/1987 | Beun et al. .................. 439/157 |
| 4,917,618 | A | * | 4/1990 | Behrens et al. ............. 439/157 |
| 4,996,631 | A | * | 2/1991 | Freehauf ..................... 439/157 |
| 5,309,325 | A | * | 5/1994 | Dreher et al. ............... 439/157 |
| 5,414,594 | A | * | 5/1995 | Hristake ..................... 439/153 |
| 5,989,043 | A | * | 11/1999 | Han et al. .................... 439/157 |
| 6,185,106 | B1 | * | 2/2001 | Mueller ....................... 439/160 |

FOREIGN PATENT DOCUMENTS

| EP | 0 330 957 B1 | 6/1994 |
| EP | 0 832 547 B1 | 4/1998 |

* cited by examiner

*Primary Examiner*—P. Austin Bradley
*Assistant Examiner*—F. O. Figueroa
(74) *Attorney, Agent, or Firm*—Pauley Petersen & Erickson

(57) ABSTRACT

An operating element having an end piece, which is arranged for connecting to a printed circuit board and a front plate. An operating lever is rotatably mounted on the end piece. The operating lever has at least one grip section and one on and/or off lever piece, which are at least partly made from a wear-resistant material. Such a design has the particular advantage that part of the operating element which performs an on and/or off lever action, the on and/or off lever piece, opposite the section of the operating element to manipulate, the handle, is at least partly made from a wear-resistant material. The complete unit is thus rendered significantly more robust without sacrificing ergonomics of the grip piece.

39 Claims, 7 Drawing Sheets

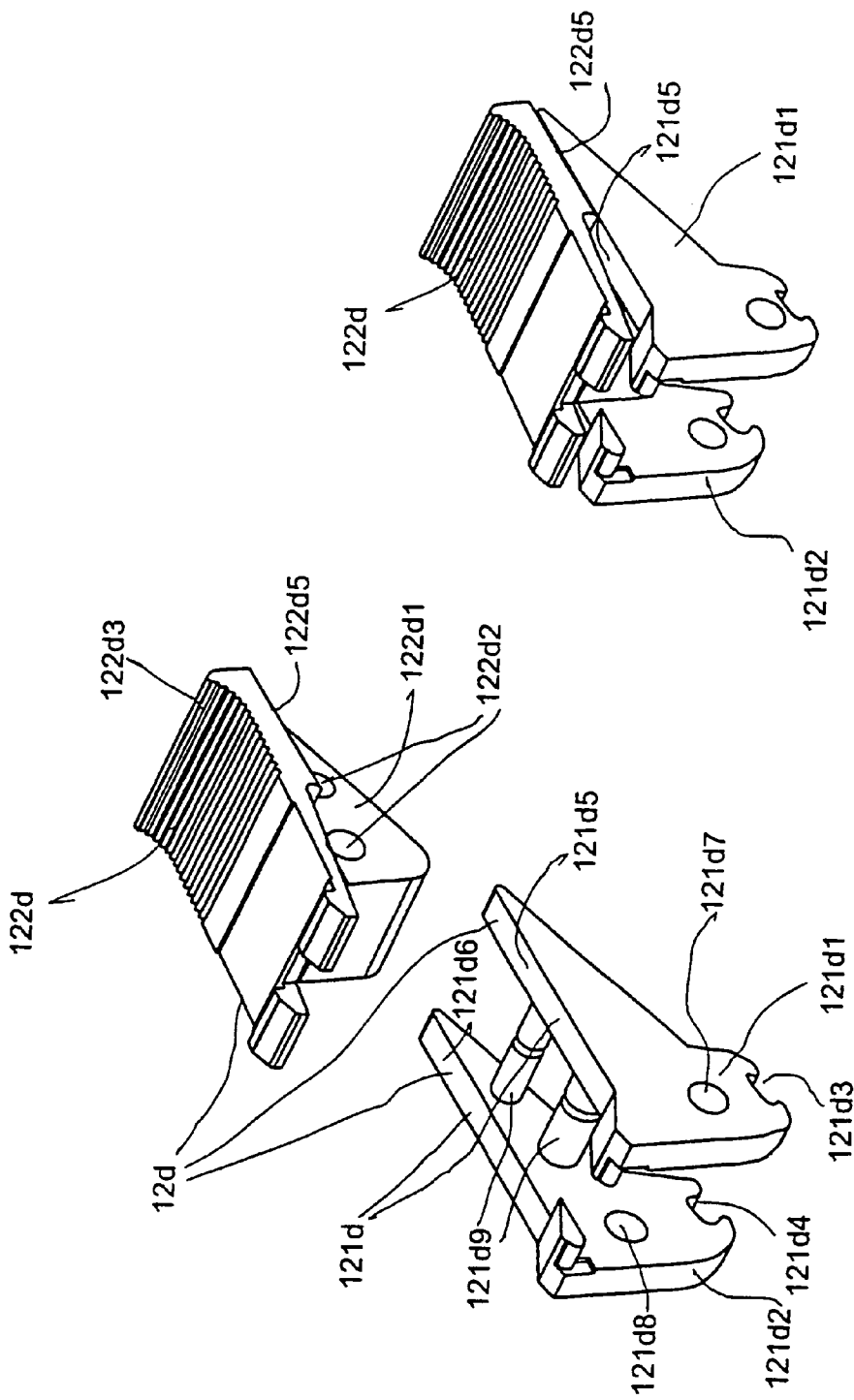

OPERATING ELEMENT WITH ON AND/OR OFF LEVER PIECE FOR PRINTED CIRCUIT BOARDS

BACKGROUND OF THE INVENTION

1. Field of the Invention

This invention relates to an operating element, by which printed circuit board modules with electronic circuits can be levered into or removed from a support system, with little application of force.

2. Description of Related Art

Similar operating elements have been employed for a considerable length of time and are known in various conventional embodiments. A widely used embodiment of such an operating element is taught by European Patent EP 0 330 957 B1. It is called a plug-in and removal aid and is part of a front system for plug-in modules which can be pushed into a module support. The plug-in and removal aid has a lever, which is rotatably seated on an end piece. An operator can actuate the plug-in and removal aid by the lever and can effect the levering in or out of the plug-in modules by appropriate pivoting. To achieve these movements, the lever has a groove, the outer edges of which are designed as protrusions. During the levering in or levering out movement, the protrusions are supported on corresponding edges of the module support, in particular on transverse connecting rails of the module support.

In connection with particular uses, the elements of an operating element, in particular those which take part in the levering in and/or levering out of a printed circuit board module, can be subjected to special stresses. This can be because of many repeated levering in and out processes. Also, special stresses can occur because it is necessary to overcome particularly high plug-in or pulling forces during the levering in or levering out process of a printed circuit board module. These can be the result of plug connectors which are attached to an edge of the printed circuit board module, and which have a large number of contact poles. Because of the increasing integration of electronic components and the increase in bit widths of digital data busses, the numbers of poles of plug connectors, in particular on printed circuit board modules supporting digital processors, show increasing values.

SUMMARY OF THE INVENTION

One object of this invention is to provide an operating element for printed circuit board modules, so that they can also withstand higher stresses.

This object is achieved by the operating element defined in the specification and the claims. Other embodiments of the operating element are disclosed in the specification and in the dependent claims. This invention relates to a method for producing the operating element and to a front system for a printed circuit board module equipped with at least one operating element, and also to a printed circuit board module with an appropriate front system, and finally relate to a module support with an appropriate front system.

An operating element in accordance with this invention has an end piece, which is prepared for connection to a printed circuit board module, and an operating lever, which is rotatably seated on the end piece. The operating lever has a handle element and an element for levering in and/or levering out, which at least partially is made of a wear-resistant material.

Such an embodiment has one advantage that a portion of the operating element in accordance with this invention which causes the levering in and/or levering out, such as the element for levering in and/or levering out, is at least partially made of a wear-resistant material, in contrast to the element intended for operating the operating element in accordance with this invention, such as the handle element. Thus the entire operating element becomes considerably more robust with respect to special stresses, without sacrificing the ergonomics of the handle element appearing.

It is particularly advantageous if the handle element is made of an ergonomically easily moldable material, such as a material by which ergonomic designs of the handle element can be produced, such as shapes and surfaces, which are simple, dependable and pleasant to touch for a person. Resilient materials are also particularly advantageous for the handle element, for example rubber-like materials, by which further requirements, such as the reduction of a possible risk of injuries, or adaptation to disadvantageous installation conditions, can also be met in addition to ergonomics.

BRIEF DESCRIPTION OF THE DRAWINGS

This invention is explained in greater detail in view of the drawing figures, wherein:

FIG. 5 is a perspective exploded lateral view of main elements of an operating element in accordance with this invention in a fourth embodiment, wherein the element for levering in and levering out has two separate engagement elements, which can be connected with the handle element by support pins;

FIG. 6 is a perspective lateral view of the operating element in accordance with FIG. 5 in the assembled state of the elements;

DESCRIPTION OF PREFERRED EMBODIMENTS

Figure 1:
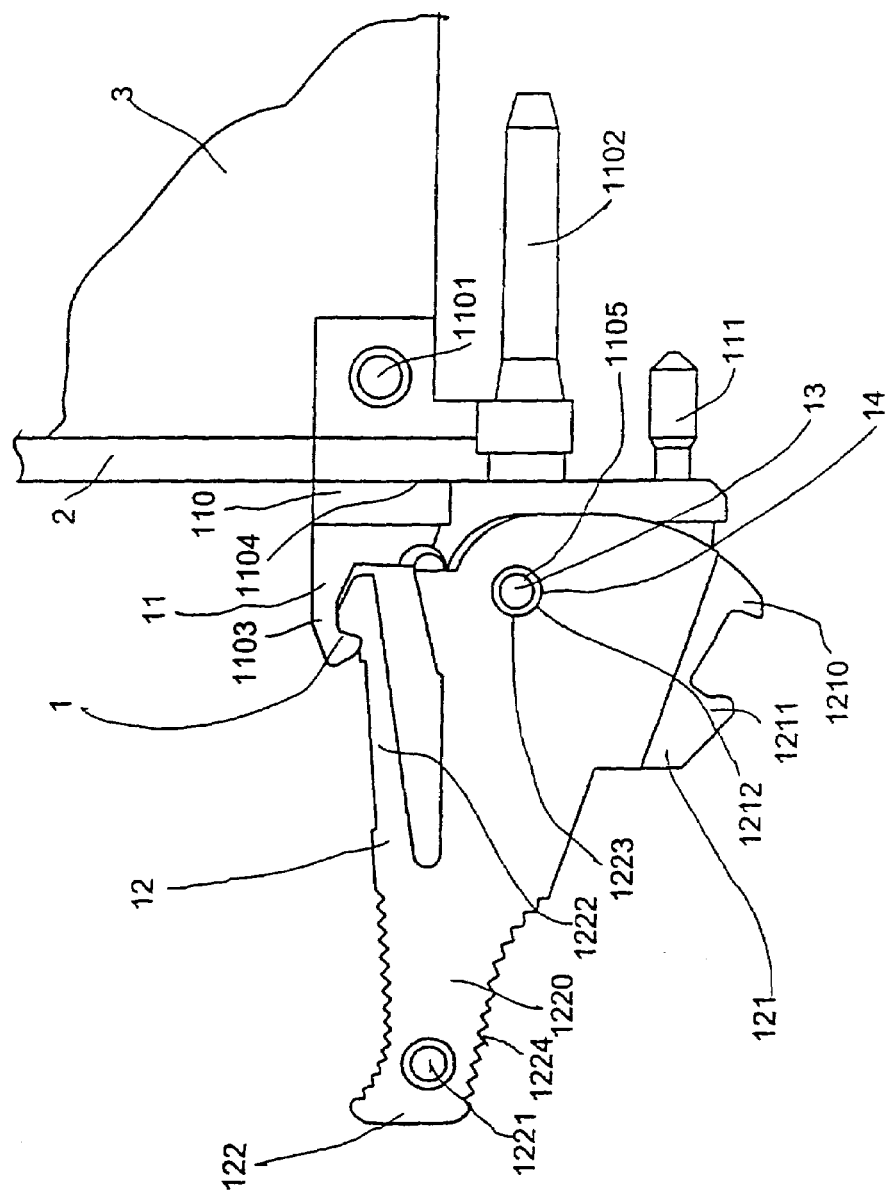
FIG. 1 is a lateral view of a basic embodiment of an operating element in accordance with this invention.

FIG. 1 represents a lateral view of a basic embodiment of an operating element 1 in accordance with this invention, used for levering in and/or levering out a printed circuit board module. As basic elements, it has an end piece 11, which is prepared to be connected with a printed circuit board module, and an operating lever 12, which is rotatably seated on the end piece 11. The operating lever 12 has an element 121 for levering in and/or levering out, which is at least partially made of a wear-resistant material, and a handle element 122, which is connected with the element 121 for levering in and/or levering out.

The end piece 11 of the operating element 1 essentially comprises a support body 110 which has a bore 1101 that can be used for fastening it on a printed circuit board, for example with a screw. The end piece 11 also has a contact pin 1102, which provides a ground contact between the elements when a printed circuit board module, which has an appropriate operating element 1, is pushed into a module support. A holding screw 111 can be provided in the support body 110 for holding a unit, which is pushed into a printed circuit board module, in place and has, for example, a printed circuit board module with a front system attached, which has a front plate and preferably two operating elements 1 at the ends. The support body 110 preferably has a bore 1105. A rotary shaft 13 can be inserted into the bore 1105, by which the operating lever 12 is rotatably seated on the support body 110. Also, a holding groove 1104 for pushing in the lower end of a front plate 2, shown in part, is advantageously provided. Finally, the support body 110 has a detent protrusion 1103 on its side facing the operating lever 12. When the operating lever 12 is in a snapped-in position, an appropriate, preferably resilient detent disk 1222 can engage the detent protrusion.

Figure 2:
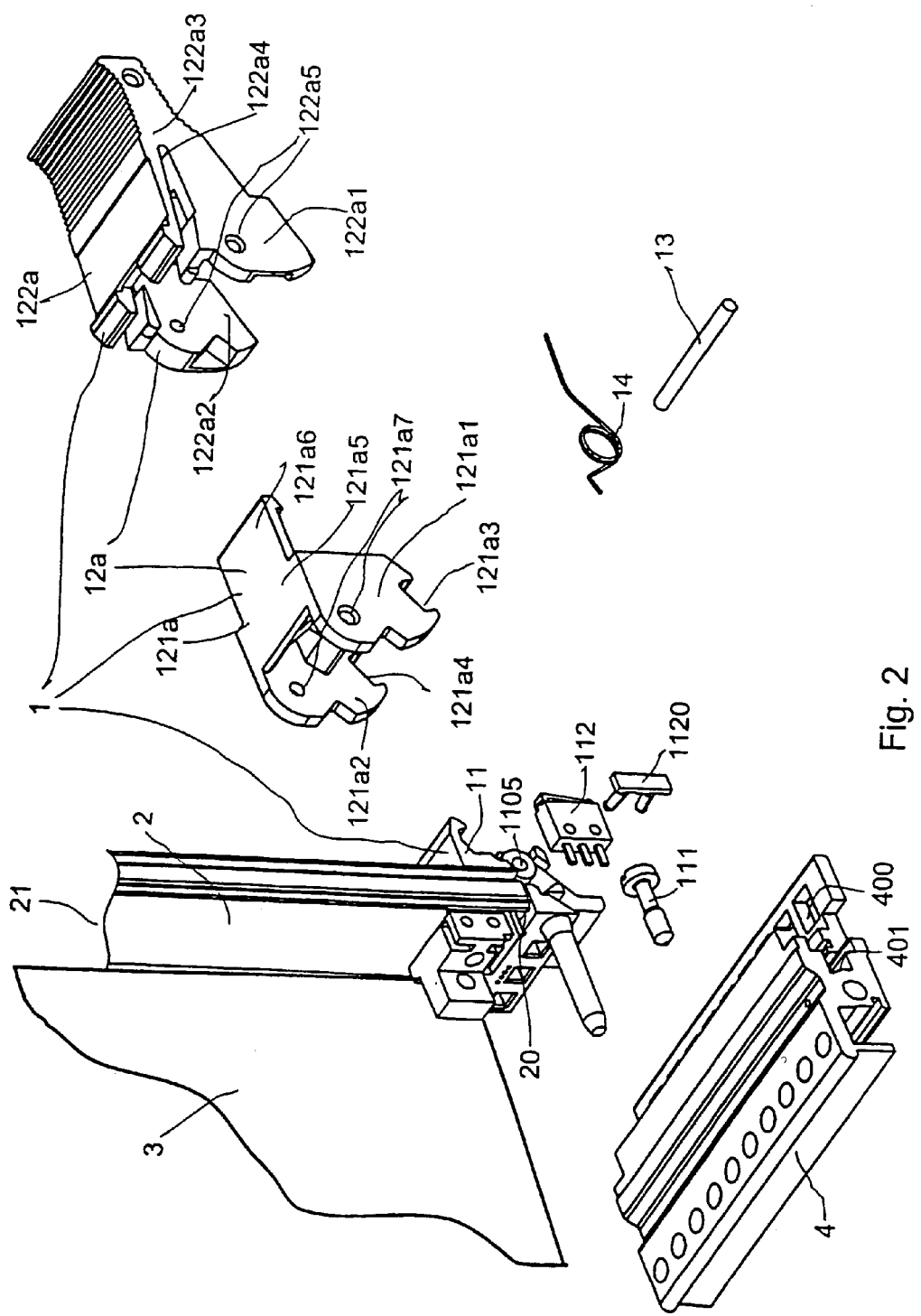
FIG. 2 is a perspective exploded lateral view of a front system for a printed circuit board module with a first exemplary embodiment of an operating element in accordance with this invention, in an exploded view, and a section of a component support, wherein an element for levering in and levering out is embodied as a die-cast element.

A microswitch 112 can be integrated into the end piece 11 of the operating element 1 together with an associated holding plug 1120, as shown in FIG. 2. The function of such a microswitch 112 is described in European Patent EP 0 832 547.

In accordance with the invention, the operating lever 12 of the operating element 1 shown in the example of FIG. 1 has a handle element 122 and a levering in and/or levering out element 121. In this case the handle element 122 has a bore 1223, the levering in and/or levering out element 121 has a bore 1212, and the end piece 11 has a bore 1105. It is possible to conduct a rotary shaft 13 through all bores so that the operating lever 12 is rotatably seated on the end piece 11. With a rotation it is possible to cause the levering in of a printed circuit board module 3, connected with the end piece, into a module support, or a levering out of the module support.

The handle element 122 has a handle head 1220, which permits an operator to grasp it manually. An additional corrugation 1224 of the surface increases the dependability of the manipulation. With the additional transverse bore 1221 at the front end of the handle head 1220, adjacently located handle elements 122 of several operating elements which are attached to various printed circuit board modules can be mechanically connected so that their synchronous movement is possible. FIG. 1 shows the handle element 122 in a position corresponding to a state of the printed circuit board module 3 when it is levered into a module support. The handle element 122 is additionally locked together in this position with the end piece 11 with the aid of detent means, in that a resilient detent disk 1222 of the handle element 122 engages a detent protrusion 1103 of the end piece 11 from behind. The operating lever 12 is moved back into the position of rest, as shown in FIG. 1, by a restoring spring 14, not shown in FIG. 1, when no downward directed force is exerted on the handle element 122.

In the example illustrated in FIG. 1, the levering in and/or levering out element 121 is inserted into the handle element 122 which surrounds the levering in and/or levering out element 121 quasi from above. In the example represented, the levering in and/or levering out element 121 also includes a levering-in protrusion 1210, as well as a levering-out protrusion 1211, wherein at least these elements are made of a wear-resistant material. Thus, it is possible with the operating lever 12 to perform the levering in, as well as the levering out, of the printed circuit board module 3. With other embodiments it is also possible for a levering in and/or levering out element 121 to be designed so that only the levering in, or the levering out is performed with it. In connection with the example of FIG. 1 this can mean that only one levering-in protrusion 1210 or only one levering-out protrusion 1211 exists.

One advantage of the embodiment in accordance with this invention of the operating element 1 is that only the elements of the operating lever 12 which are particularly stressed in during levering in or levering out processes, such as the levering in and/or levering out element 121, is made of a wear-resistant material, while all remaining elements, in particular the handle element 122, can be made of materials which are more easily shaped or designed, such as of a plastic material. The material can preferably be selected so that it can be easily shaped ergonomically. In another embodiment the handle element 122 of the operating lever 12 can be made of a resilient material, in particular of rubber or another elastomer.

As previously explained, in the example shown in FIG. 1, all parts of the operating element 1 are connected with each other via a common rotary shaft 13. In a different embodiment of the operating element 1, the handle element 122 and the levering in and/or levering out element 121 of the operating lever 12 can also be permanently connected with each other. The handle element 122 and the levering in and/or levering out element 121 can advantageously also be connected in one piece with each other. It is also advantageous if the handle element 122 of the operating element 1 is formed as one piece on the levering in and/or levering out element, in particular by injection molding. Again, an elastomeric material is particularly advantageously suited for this purpose.

FIG. 2 shows an exploded view of a front system in accordance with this invention for a printed circuit board module 3 in a perspective exploded lateral view, along with a further exemplary embodiment of an operating element 1a in accordance with this invention. A module support is also partially illustrated. The partial view shows an area of a lower transverse connecting rail 4 having a series of engagement holes 400. The levering-in and levering-out protrusions 121a3, 121a4, which are made of a wear-resistant material, enter into the protrusions 121a3, 121a4 or grasp it when the printed circuit board module 3 is levered-in, or levered out, during the actuation of the operating lever 12a. In the process, the levering-out protrusions 121a4 are supported on the exterior of the transverse connecting rail 4, while the levering-in protrusions 121a3 are supported in the interior of the engagement holes 400. Furthermore, the portion of a transverse connecting rail 4 of a module support represented in FIG. 2 has a transverse groove 401. A holding screw 111 for fixing the front plate in place can be screwed into it.

The front system for the printed circuit board module 3 represented in FIG. 2 has a partially shown front plate 2. An operating element 1a is attached to its lower end 20. A corresponding operating element is also attached to the upper end 21 of the front plate 2, but is not shown in FIG. 2. The front system is attached to a printed circuit board module 3, also only partially represented. The operating element 1a in FIG. 2 has an end piece 11, which corresponds to the embodiment in FIG. 1, and an operating lever 12a including a levering in and/or levering out element 121a and a handle element 122a. The printed circuit board module 3 can be levered-in or levered-out of a module support which has at least one corresponding transverse connecting rail 4.

The handle element 121a of the operating element 1a is made of plastic, for example, and has a protruding handle head 122a3, from which first and second flanks 122a1, 122a2 extend downward. It is possible to make the connection of the handle element 122a with the levering in and/or levering out element 121a easier, because the lateral flanks 122a1, 122a2 enclose the levering in and/or levering out element 121a for improved guidance when the handle element 121a is placed on the levering in and/or levering out element 121, or the levering in and/or levering out element 121 is inserted into the handle element 122a. Again, a rotary shaft 13 can be inserted through the bores 122a5 for connecting the elements. The handle element 121a also has resilient detent disks 122a4.

The levering in and/or levering out element 121a of the operating element 1a represented in FIG. 2 has two engagement elements 121a1 and 121a2, which are arranged next to each other. Each one of these engagement elements has a separate group of levering-in and levering-out protrusions 121a3, 121a4. In the example of FIG. 2, the two engagement elements 121a1, 121a2 are advantageously connected with each other in one piece by a connecting element 121a5. The connecting element 121a5 has a holding blade 121a6 as an extension which, when the handle element 122a is attached, dives into the space between the flanks 122a1, 122a2 and can be held in place there, possibly with additionally provided elements. The levering in and/or levering out element 121 in FIG. 2 is advantageously a die-cast element, in particular made of aluminum and/or zinc. The engagement elements 121a1, 121a2 also have bores 121a7 for the insertion of a rotary shaft 13.

Figure 3:
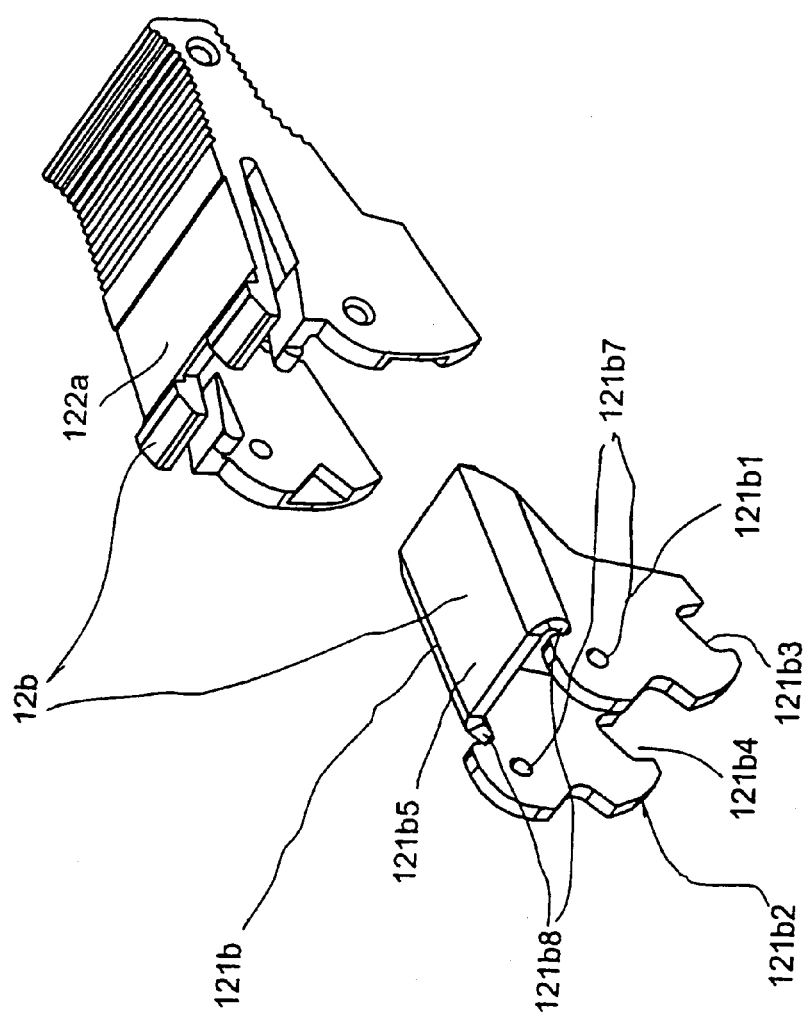
FIG. 3 is a perspective exploded lateral view of main elements of an operating element in accordance with this invention in a second embodiment, wherein the element for levering in and levering out is embodied as a bent plate element.

FIG. 3 represents a perspective exploded lateral view of main elements of an operating lever 12b for an operating element in accordance with this invention, in a further embodiment. In this case the associated levering in and/or levering out element 121b has a first and a second engagement element 121b1, 121b2 arranged so they are located approximately parallel next to each other. Each engagement element 121b1, or 121b2, has a complete group 121b3, or 121b4, of levering-in and levering-out protrusions. Each of the engagement elements has a bore 121b7 for a rotary shaft, by which the levering in and/or levering out element 121b can be combined into one operating element with the handle element 122a and an end piece 11. The handle element 122a is similar to the embodiment described in view of FIG. 2.

In the example of FIG. 3, the element for levering in and/or levering out 121b is embodied as a punched-and-bent element, in particular made of sheet metal. In this case the total arrangement of the parallel engagement elements 121b1, 121b2 and a connecting back 121b5, which connects the latter in one piece, is created from an originally flat sheet metal piece, made into the U-shaped structure in FIG. 3 by appropriate bending. In such embodiment, bulges 121b8 in the material usually occur at the transitions between the engagement elements 121b1, 121b2 and the connecting back 121b5. These can be used for improving the fixation of the element for levering in and/or levering out 121b in the handle element 122a, after placed on the former.

Figure 4:
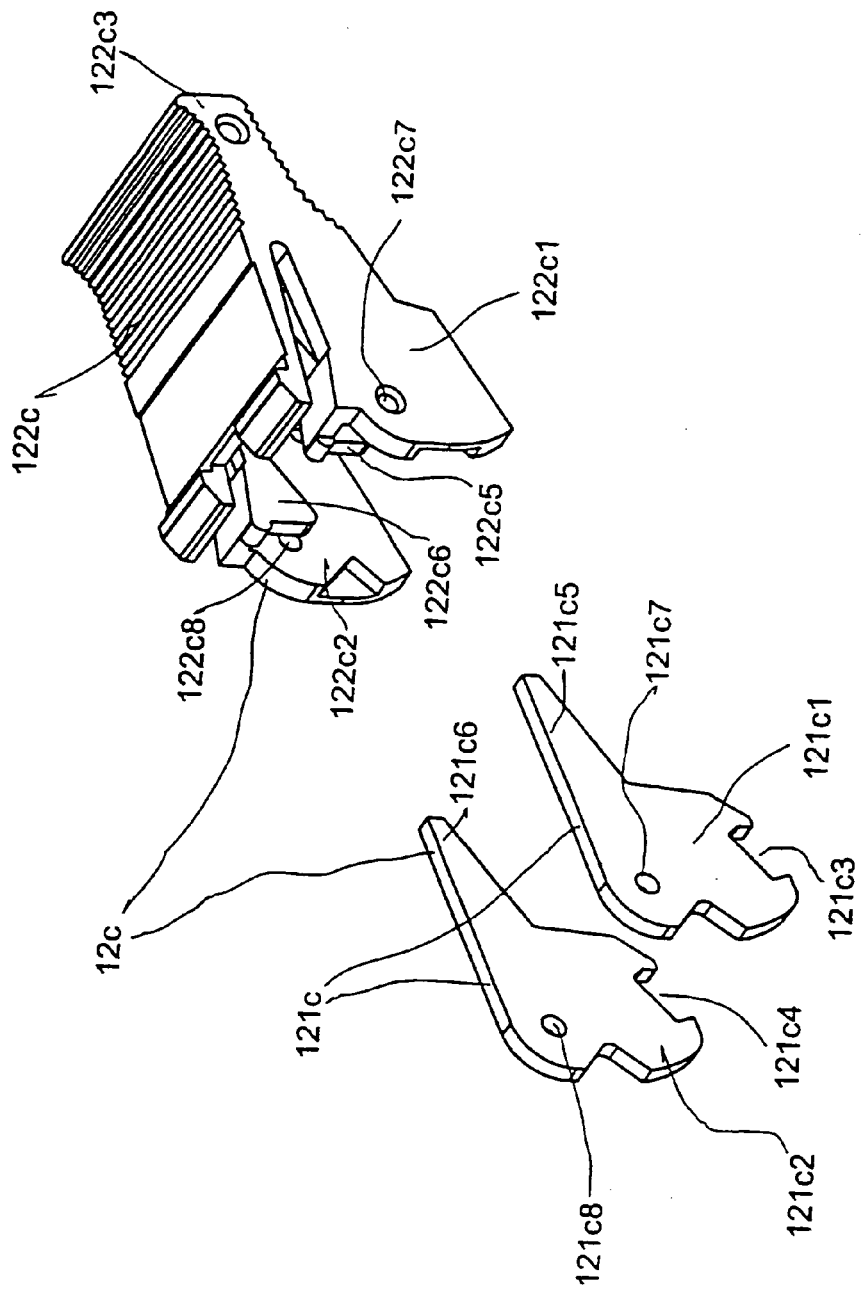
FIG. 4 is a perspective exploded lateral view of main elements of an operating element in accordance with this invention in a third embodiment, wherein the element for levering in and levering out has two separate engagement elements.

FIG. 4 shows a perspective lateral exploded view of the main elements of an operating lever 12c for an operating element in accordance with this invention in a further embodiment. Here, the element for levering in and/or levering out 121c has two separate engagement elements 121c1, 121c2, each of which has a separate group of levering-in and levering-out protrusions. The engagement elements 121c1, 121c2 are embodied as punched-and-bent elements, for example. So that they can be positioned lying approximately parallel next to each other, each engagement element 121c1, or 121c2, has an extension in the form of a clamping strip 121c5, or 121c6. To hold them in place, the associated handle element 122c has corresponding holding elements 122c5, 122c6. In the example of FIG. 4, these are embodied as clamping brackets 122c5, 122c6 and are attached to the insides of a first and second flank 122c1, 122c2 of the handle element 122c. The clamping strips of the engagement elements 121c1, 121c2 can be inserted knife-like in receiver spaces, which are formed between the insides of the respective flank and the corresponding clamping brackets on the underside of the protruding handle head 122c3 of the handle element 122c. Thus it is possible to connect the element for levering in and/or levering out 121c with the handle element 122c to form the operating lever 12c, even without the aid of a rotary shaft. In the example of FIG. 4, the engagement elements 121c1, 121c2 have bores 121c7, 121c8 and the flanks 122c1, 122c2 of the handle element 122c have bores 122c7, 122c8 for a rotary shaft. Thus the entire operating lever 12c can be fixed in place on an end piece 11.

FIG. 5 shows a perspective lateral view of the main elements of an operating lever 12d for an operating element in accordance with a further embodiment. Again, the element for levering in and/or levering out 121d has two separate engagement elements 121d1, 121d2, which are embodied as die-cast elements made of zinc or aluminum. Each one again has a separate group 121d3, 121d4 of levering-in and levering-out protrusions. Respectively, two support pins 121d9 are formed on the inside of each of the engagement elements 121d1, 121d2, for example. The engagement elements 121d1, 121d2 can be connected with an associated handle element 122d with the aid of the support pins. The handle element 122d is made of plastic, for example, and has a support bracket 122d1 located underneath the protruding handle head 122d3. Moreover, contact faces 122d5 are created on both sides of the underside of the handle head 122d3. These rest on the tops of resting strips 121d5, 121d6 of the engagement elements 121d1, 121d2 during assembly. During this their support pins 121d9 engage corresponding receiver openings 122d2 in the support bracket 122d1 of the handle element 122d.

FIG. 6 shows a perspective lateral view of all elements in FIG. 5 in an assembled state. Here, the handle element 122a of the operating lever 12a rests on the element for levering in and/or levering out 121a, while the engagement elements 121d1, 121d2 extend around the support bracket 122d1. Finally, the engagement elements 121d1, 121d2 again have bores 121d7, 121d8 for a rotary shaft 13.

Figure 7:
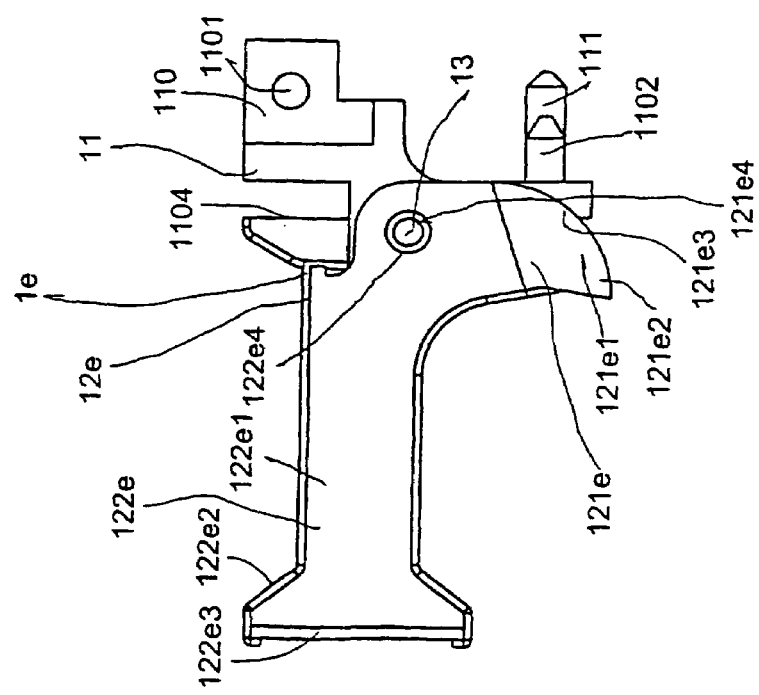
FIG. 7 is a lateral view of a further embodiment of an operating element in accordance with this invention, wherein the handle element has a handle head which projects toward the front.

FIG. 7 represents a lateral view of a further embodiment of an operating element 1e in accordance with this invention, wherein the handle element 122e, which is made of plastic, for example, of the associated operating lever 12e has a handle head 122e1, which greatly projects toward the front. The left side of the handle head 122e1 terminates in a T-shaped front element 122e2, into which lettering elements 122e3, for example, can be inserted. A rotary shaft for holding an element for levering in and/or levering out 121e, made of a wear-resistant material and located in the interior, can again be inserted through receiver bores 122e4 in the handle element 122e. The element has at least one engagement element 121e1, which has a levering-in protrusion 121e3 for performing a levering in action, and a levering-out back 121e3 for performing a levering out action. A rotary shaft 13 can be inserted through a bore 121e4 for connection with the end piece 11. This substantially corresponds to the design explained by FIG. 1.

Figure 8:
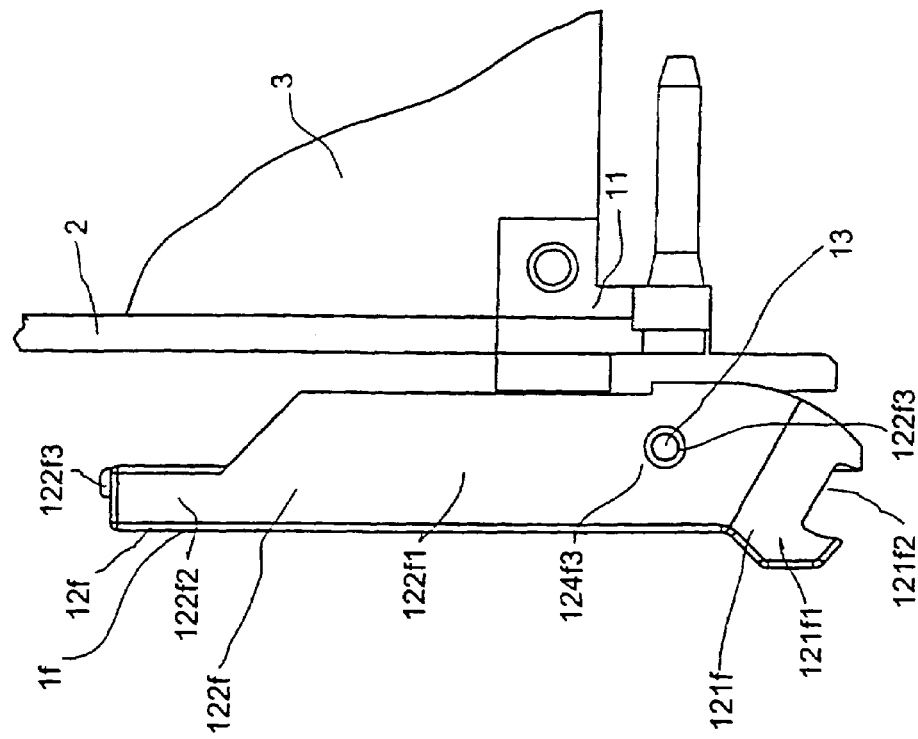
FIG. 8 is a lateral view of a further embodiment of an operating element in accordance with this invention, wherein the handle element has an upward projecting handle head.

FIG. 8 represents a lateral view of a further embodiment of an operating element 1f in accordance with this invention. In this case the operating lever 12f has a handle element 122f with an upright handle body 122f1 and a tapered handling depression 122f2 at the head end. In this embodiment the handle body 122f, again made of plastic, nestles in a space-saving manner against a front plate 2 located behind it. In the example represented in FIG. 8, a locking element 122f3 is integrated the handle element 122f, by means of which the operating lever 12f can be locked in the position represented. The handle element 122f is connected with an element for levering in and/or levering-out 121f, and this connection is again advantageously made by a rotary shaft 13, which is inserted through a bore 121f3 into the handle element 122f, the element for levering in and/or levering out 121f and the end piece 11. The element for levering in and/or levering out 121f has at least one engagement element 121f1, which has a group 121f2 of levering-in and levering-out protrusions. At least these elements of the element for levering in and/or levering out 121f are made of a wear-resistant material.

Figure 9:
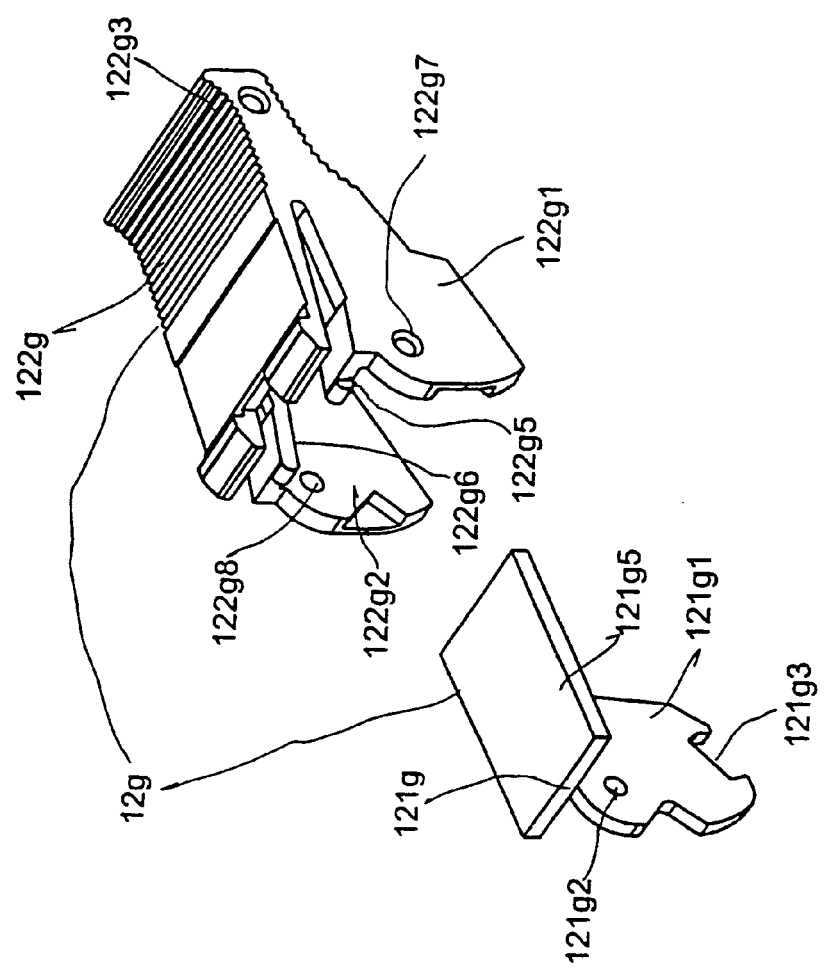
FIG. 9 is a perspective exploded lateral view of main elements of an operating element in accordance with this invention in a further embodiment, wherein the element for levering in and levering out has an engagement element with a support plate attached in a T-shape to the top.

FIG. 9 represents a perspective exploded lateral view of the main elements of an operating lever 12g for an operating element in accordance with this invention, in a further embodiment. In this case the element for levering in and/or levering out 121g has a centrally arranged engagement element 121g1 with a group 121g3 of levering-in and levering-out protrusions and a support plate 121g5, placed on it in a T-shape. The element for levering in and/or levering out 121g is embodied as a die-cast element made of zinc or aluminum, for example. A rotary shaft can again be inserted through a bore 121a2. The associated handle element 122g is made of plastic, for example, and has a protruding handle head 122g3 with flanks 122g1, 122g2 extending laterally downward. Receiver faces 122g1, 122g2 for the support plate 121g5 result underneath the handle head 122g3. The flanks 122g1, 122g2 have bores 122g7, 122g8, into which a rotary shaft can be inserted which, in the assembled state, also penetrates through the bore 121g2 in the engagement element 121g1 located inbetween.

The invention claimed is:

1. An operating element (1) for levering a printed circuit board module (3) in and out, comprising:
an end piece (11) prepared for a connection with the printed circuit board module (3), the end piece (11) including a detent protrusion (1103);
an operating lever (12, 12a, 12b, 12c, 12d, 12e, 12f, 12g) rotatably seated on the end piece (11) and having a handle element (122, 122a, 122b, 122c, 122d, 122e, 122f, 122g) and an element for at least one of levering in and levering out (121, 121a, 121b, 121c, 121d, 121e, 121f, 121g) made at least partially of a wear-resistant material;
the handle element including a resilient detent disk (1222) adapted to engage the end piece detent protrusion (1103); and
the element for at least one of levering in and levering out (121, 121a, 121b, 121c, 121d, 121e, 121f, 121g) including two engagement elements (121a1, 121a2, 121b1, 121b2, 121c1, 121c2, 121d1, 121d2) arranged next to each other and connected in one piece by a connecting element (121a5, 121b5), each of the two engagement elements including a leveling-in protrusion (1210) and a leveling-out protrusion (1211) made of a wear-resistant material.

2. The operating element (1) in accordance with claim 1, wherein the handle element (122c) has a support (122c5, 122c6) for holding at least one of the engagement elements (121c1, 121c2).

3. The operating element (1) in accordance with claim 2, wherein at least one support pin (121d9) is formed on at least one of the engagement elements (121d1, 121d2), and the handle element (122d) has at least one receiver opening (122d2) for at least one support pin (121d9).

4. The operating element (1) in accordance with claim 3, wherein the element for at least one of levering in and levering out (121a, 121d, 121e, 121f) is of a die-cast element of at least one of aluminum and zinc.

5. The operating element (1) in accordance with claim 3, wherein the element for at least one of levering in and levering out (121c) is a punched element.

6. The operating element (1) in accordance with claim 3, wherein the element for at least one of levering in and levering out (121b, 121gc) is a punched-and-bent element.

7. The operating element (1) in accordance with claim 6, wherein the handle element (122a) of the operating lever (12a) has at least one lateral flaw (122a1, 122a2) which surrounds the element for at least one of levering in and levering out (121a).

8. The operating element (1) in accordance with claim 7, wherein the element for at least one of levering in and levering out (121a) of the operating lever (12a) is inserted into the handle element (122a).

9. The operating element (1) in accordance with claim 8, wherein the handle element (122a) of the operating lever (12a) rests on the element for at least one of levering in and levering out (121a).

10. The operating element (1) in accordance with claim 9, wherein the handle element (122) of the operating lever (12) has a detent (1222).

11. The operating element (1) in accordance with claim 10, wherein the handle element (122) of the operating lever (12) is made of a plastic material.

12. The operating element (1) in accordance with claim 11, wherein the handle element (122) of the operating lever (12) is made of a resilient material.

13. The operating element (1) in accordance with claim 12, wherein the end piece (11), the element for at least one of levering in and levering out (121, 121a) and the handle element (122, 122a) of the operating lever (12, 12a) each has a bore (1105, 1112, 1123, 121a7, 122a5) and all are connected with each other by an inserted rotary shaft (13).

14. The operating element (1) in accordance with claim 13, wherein the handle element (122) and the element for at least one of levering in and levering out (121) of the operating lever (12) are permanently connected with each other.

15. The operating element (1) in accordance with claim 14, wherein the handle element (122) is formed as one piece on the element for at least one of levering in and levering out by injection molding.

16. The operating element (1) in accordance with claim 14, wherein the handle element (122) is formed as one piece on the element for at least one of levering in and levering out.

17. The operating element (1) in accordance with claim 16, wherein the handle element (122) is formed as one piece on the element for at least one of levering in and levering out by injection molding.

18. A front system for a printed circuit board module (3) including a front plate (2) and the operating element (1) of claim 16 attached to an end (20) of the front plate (2).

19. The front system in accordance with claim 18, wherein the printed circuit board module (3) has the front system.

20. The front system in accordance with claim 18, wherein a module support (4) is designed so that the printed circuit board module (3) has the front system and can be levered at least one of in and out.

21. The operating element (1) in accordance with claim 1, wherein at least one support pin (121d9) is formed on at least one of the engagement element and a second engagement element (121d1, 121d2), and the handle element (122d) has at least one receiver opening (122d2) for the at least one support pin (121d9).

22. The operating element (1) in accordance with claim 1, wherein the element for at least one of levering in and levering out (121a, 121d, 121e, 121f) is of a die-cast element of at least one of aluminum and zinc.

23. The operating element (1) in accordance with claim 1, wherein the element for at least one of levering in and levering out (121c) is a punched element.

24. The operating element (1) in accordance with claim 1, wherein the element for at least one of levering in and levering out (121b, 121gc) is a punched-and-bent element.

25. The operating element (1) in accordance with claim 1, wherein the handle element (122a) of the operating lever (12a) has at least one lateral flank (122a1, 122a2) which surrounds the element for at least one of levering in and levering out (121a).

26. The operating element (1) in accordance with claim 1, wherein the element for at least one of levering in and levering out (121a) of the operating lever (12a) is inserted into the handle element (122a).

27. The operating element (1) in accordance with claim 1, wherein the handle element (122a) of the operating lever (12a) rests on the element for at least one of levering in and levering out (121a).

28. The operating element (1) in accordance with claim 1, wherein the handle element (122) of the operating lever (12) has a detent (1222).

29. The operating element (1) in accordance with claim 1, wherein the handle element (122) of the operating lever (12) is made of a plastic material.

30. The operating element (1) in accordance with claim 1, wherein the handle element (122) of the operating lever (12) is made of a resilient material.

31. The operating element (1) in accordance with claim 1, wherein the end piece (11), the element for at least one of levering in and levering out (121, 121a) and the handle element (122, 122a) of the operating lever (12, 12a) each has a bore (1105, 1112, 1123, 121a7, 122a5) and all are connected with each other by an inserted rotary shaft (13).

32. The operating element (1) in accordance with claim 1, wherein the handle element (122) and the element for at least one of levering in and levering out (121) of the operating lever (12) are permanently connected with each other.

33. The operating element (1) in accordance with claim 32, wherein the handle element (122) is formed as one piece on the element for at least one of levering in and levering out.

34. A front system for a printed circuit board module (3) including a front plate (2) and the operating element (1) of claim 1 attached to an end (20) of the front plate (2).

35. An operating element (1) for levering a printed circuit board module (3) in and out, comprising:
an end piece (11) prepared for a connection with the printed circuit board module (3),
an operating lever (12, 12a, 12b, 12c, 12d, 12e, 12f, 12g) rotatably seated on the end piece (11) and having a handle element (122, 122a, 122b, 122c, 122d, 122e, 122f, 122g) and an element for at least one of levering in and levering out (121, 121a, 121b, 121c, 121d, 121e, 121f, 121g) made at least partially of a wear-resistant material;
the element for at least one of levering in and levering out (121, 121a, 121b, 121c, 121d, 121e, 121f, 121g) including two engagement elements (121a1, 1211a2, 121b1, 121b2, 121c1, 121c2, 121d1, 121d2) arranged next to each other, each of the two engagement elements including a leveling-in protrusion (1210) and a leveling-out protrusion (1211) made of a wear-resistant material; and
the handle element (122c) having a support (122c5, 122c6) for holding the two engagement elements.

36. The operating element (1) in accordance with claim 35, wherein the element for at least one of levering in and levering out (121c) is a punched element.

37. The operating element (1) in accordance with claim 35, wherein the handle element (122a) of the operating lever (12a) has at least one lateral flank (122a1, 122a2) which surrounds the element for at least one of levering in and levering out (121a).

38. The operating element (1) in accordance with claim 35, wherein the element for at least one of levering in and levering out (121a) of the operating lever (12a) is inserted into the handle element (122a).

39. A front system for a printed circuit board module (3) including a front plate (2) and the operating element (1) of claim 35 attached to an end (20) of the front plate (2).

* * * * *